(12) United States Patent
Borges et al.

(10) Patent No.: US 8,416,214 B2
(45) Date of Patent: Apr. 9, 2013

(54) TOUCH SCREEN COUPLING HAVING TACTILE RESPONSE CAPABILITY

(75) Inventors: Joao Eduardo Santana Borges, Evansville, IN (US); Melissa J. Burchill, Benton Harbor, MI (US); Craig C. Lear, Saint Joseph, MI (US); Jess E. Mutschler, Saint Joseph, MI (US); Phabio Junckes Setubal, Joinville (BR); Cesario Zimmermann, Joinville (BR)

(73) Assignee: Whirlpool Corporation, Benton Harbor, MI (US)

( * ) Notice: Subject to any disclaimer, the term of this patent is extended or adjusted under 35 U.S.C. 154(b) by 413 days.

(21) Appl. No.: 12/730,291

(22) Filed: Mar. 24, 2010

(65) Prior Publication Data

US 2011/0234527 A1    Sep. 29, 2011

(51) Int. Cl.
    *G06F 3/045* (2006.01)
(52) U.S. Cl.
    USPC .......................... 345/174; 345/173
(58) Field of Classification Search ........... 345/173, 345/174
    See application file for complete search history.

(56) References Cited

U.S. PATENT DOCUMENTS

| | | | |
|---|---|---|---|
| 4,476,463 A | 10/1984 | Ng et al. | |
| 4,633,086 A * | 12/1986 | Parrish | 250/338.1 |
| 5,305,017 A | 4/1994 | Gerpheide | |
| 5,345,807 A * | 9/1994 | Butts et al. | 73/1.15 |
| 5,825,352 A | 10/1998 | Bisset et al. | |
| 5,869,791 A | 2/1999 | Young | |
| 5,933,102 A | 8/1999 | Miller et al. | |
| 5,995,026 A | 11/1999 | Sellers | |
| 6,297,811 B1 | 10/2001 | Kent et al. | |
| 6,452,514 B1 | 9/2002 | Philipp | |
| 6,690,360 B2 | 2/2004 | Johnston et al. | |
| 6,885,317 B1 | 4/2005 | Gutowitz | |
| 6,949,723 B2 | 9/2005 | Staebler et al. | |
| 7,091,952 B2 | 8/2006 | Johnston et al. | |
| 7,148,704 B2 | 12/2006 | Philipp | |
| 7,295,190 B2 * | 11/2007 | Philipp | 345/173 |
| 7,423,634 B2 | 9/2008 | Amiri | |
| 2007/0079246 A1 | 4/2007 | Morillon et al. | |
| 2009/0039239 A1 | 2/2009 | Amoriza Berasaluce et al. | |
| 2009/0091906 A1 | 4/2009 | Arione et al. | |

\* cited by examiner

FOREIGN PATENT DOCUMENTS

| | | |
|---|---|---|
| KR | 2004103562 A | 12/2004 |
| KR | 2009049863 A | 5/2009 |
| KR | 2010002370 A | 1/2010 |

OTHER PUBLICATIONS

International Search Report, PCT Application No. PCT/US2011/029574, filed on Mar. 23, 2011, international search completion date of Nov. 30, 2011, Applicant: Whirlpool Corporation.

*Primary Examiner* — Kevin M Nguyen
*Assistant Examiner* — Sepideh Ghafari
(74) *Attorney, Agent, or Firm* — Kirk W. Goodwin; Peter J. Melsa

(57) ABSTRACT

The presently described technology relates to an appliance control panel system having a control panel interface comprising at least one capacitive touch key, and a circuit board assembly comprising at least one input receiver pad. The control panel interface and the circuit board assembly are not in direct contact with each other. The input receiver pad can be comprised of a conductive material. Certain embodiments also provide a control panel having at least one conductive extender. The extender can be situated between the control panel interface and the circuit board assembly. The capacitive touch key is in electrical connection with the input receiver pad. An method for controlling an appliance with a control panel is also disclosed.

20 Claims, 5 Drawing Sheets

TOUCH SCREEN COUPLING HAVING TACTILE RESPONSE CAPABILITY

BACKGROUND OF THE INVENTION

1. Field of the Invention

The presently described technology generally relates to electrical control panels. More specifically, the presently described technology relates to capacitive touch electrical control panels for appliances.

2. Description of the Related Art

Capacitive sensors have become increasingly common and accepted for use in human interfaces and for machine control. In the field of home appliances, it is now quite common to find capacitive touch controls operable through functioning user interfaces or control panels. Touch controls, touch switches or touch pads are often used to replace conventional mechanical or tactile switches. Unlike tactile or mechanical switches, touch pads contain no moving parts to break or wear out. Moreover, touch pads can be mounted or formed on a continuous substrate sheet, such as a touch panel, without the need for openings in the substrate. The use of touch pads in place of mechanical or tactile switches can therefore be advantageous, particularly in environments where contaminants are likely to be present. Touch panels are also easier to clean than typical mechanical switch panels because they can be made without openings in the substrate that would allow penetration of contaminants. As a result, touch panels can offer a unique "high end" type of control panel experience, allowing a user to activate a control panel switch by placing an item such as a stylus or a finger at an area or a key of the control panel.

Although touch pads solve many problems associated with mechanical switches, known touch pad designs can still give rise to problems. For example, many known touch pads can malfunction when contaminants such as water or other liquids are present on the substrate. The contaminant can act as a conductor for the electric fields created about the touch pads, causing unintended switch actuations. This can present problems in areas where such contaminants are commonly found, such as household kitchens. Touch pads can also be susceptible to unintended actuations due to electrical noise or other interferences affecting a touch pad or the leads extending from the touch switch to its associated control circuit. This problem can be aggravated in applications where the touch pad is a relatively large distance away from the control circuitry.

Tactile control panels, on the other hand, offer their own benefits to users. For example, a tactile responsive control panel can offer an assurance to a user that the tactile response (or button, key, etc.) has indeed been activated. Such a response can be made with a noise such as a clicking of a button or a spring, or by the sensation provided by the depression of the tactile key, for example. Further, because tactile keys provide a mechanical mechanism for activating a switch, the tactile key can be separated from the circuit board by a distance without losing accuracy, such as in the form of a reduced signal to noise ratio, which can be present in a capacitive touch panel.

In certain situations, it is therefore desirable for an appliance producer to be able to offer an appliance for sale with an option of either a tactile responsive control panel or a capacitive touch control panel. It would be desirable to minimize the amount of differences in circuitry to reduce costs in manufacturing of the appliance with the multiple options and/or configurations. Further, in certain situations it is necessary to provide a touch pad that requires different functionality in various operation modes.

As a result, there exists an ongoing challenge to provide a control panel that operates as a capacitive touch panel and is easily adaptable to be used as a tactile control. Moreover, there exists an ongoing challenge to provide a circuit board assembly that can be used with either a capacitive touch panel or a tactile panel. Further, there is an ongoing challenge to provide a control panel having touch pads capable of performing multiple functionalities in a variety of operation modes.

BRIEF SUMMARY OF THE INVENTION

Certain embodiments of the presently described technology present one or more appliance control panel systems having a control panel interface comprising at least one capacitive touch key, and a circuit board assembly (e.g., a printed circuit board assembly) comprising at least one input receiver pad. The control panel interface and the circuit board assembly are not in direct contact with each other (i.e., there exists a space between the interface and the circuit board assembly). The input receiver pad can be comprised of a conductive material. Certain embodiments also provide a control panel having at least one conductive extender. The extender can be situated between the control panel interface and the circuit board assembly. The capacitive touch key is in electrical connection with the input receiver pad.

In certain embodiments a circuit board assembly (e.g., a printed circuit board assembly) that is adapted for use with each of a touch control panel and a tactile touch panel is provided. The circuit board assembly comprises a printed circuit board and a receptor panel electrically connected to the printed circuit board. The receptor panel has at least one receiver pad. The receiver pad has a conductive surface and at least one tactile switch connector, such as a tactile switch soldering pad, for example.

In certain embodiments, systems and methods for providing an appliance control panel system comprising providing a control panel interface having at least one tactile key are provided. The systems and methods further provide a circuit board assembly having at least one input receiver pad comprised of a one or more conductive materials, such as copper, for example. The systems and methods further provide a tactile extender. When the control panel interface is not in direct contact with the circuit board assembly, the tactile extender is positioned between the control panel interface and the circuit board assembly. The tactile key is therefore in mechanical connection with the input receiver pad through the tactile extender.

DETAILED DESCRIPTION OF THE PREFERRED EMBODIMENT

Figure 1:
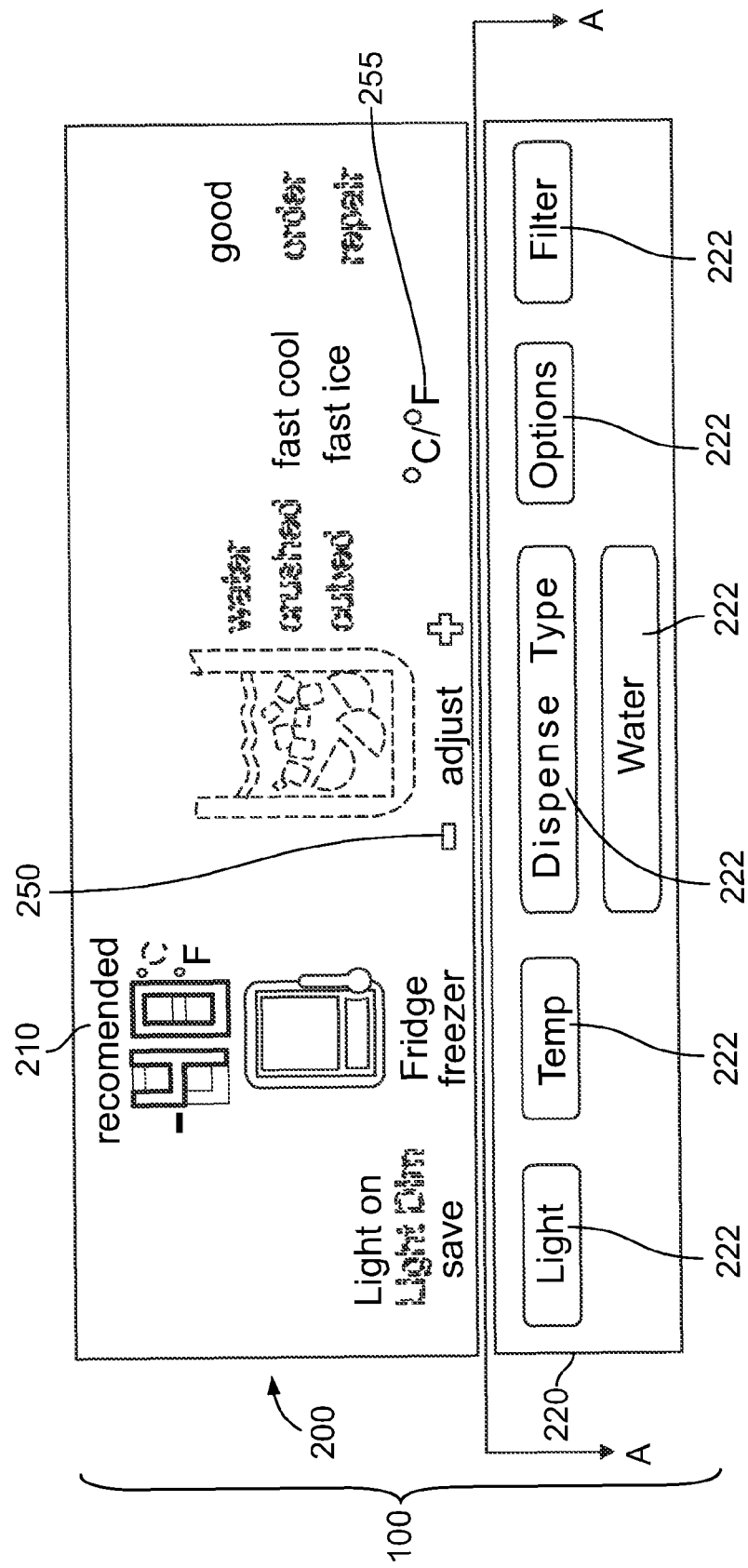
FIG. 1 depicts an interface of an appliance control panel in accordance with an embodiment of the presently described technology.

The presently described technology describes embodiments of devices and methods for providing a control panel having tactile switch and capacitive touch capability in the same physical space, for example.

In appliance control panels, it is becoming desirable to provide a visual display in conjunction with a control panel. Such a display can be in the form of a small digital screen, or a larger digital interface, such as a liquid crystal display (LCD) screen or display. In such a situation, the control panel may be situated a certain distance away from the electronic circuitry behind the control panel to allow for the space required to accommodate the display. Accordingly, the keys or switches of the control panel may require an extender to transmit a signal when a key is pressed to the control circuitry. For example, for a tactile switch, a mechanical lever or a rigid device may span the gap between the switch with the circuit board assembly. For a touch panel, spanning this gap can be difficult for various reasons. An electrical connection that covers a larger distance may have a reduced signal to noise ratio, for example, or be open to unintended actuations due to electrical noise or other interferences affecting a touch pad or the leads extending from the touch switch to its associated control circuit.

In certain situations, it may be desirable to provide an appliance, such as a washing machine, a dishwasher, a refrigerator, a stove and/or oven, or a microwave, for example, with a control panel capable of offering both tactile switch and touch panel capability. For example, it may be desired to offer a higher end product line of an appliance that provides a touch panel, and a more affordable product line of the same appliance that offers a tactile switch control panel. In this situation, it would be desirable to avoid the need for producing two entirely different control panels for each product line. It would be beneficial to maintain the same relative circuitry for both embodiments, so that only minor changes need to be accounted for between the product lines. Accordingly, certain embodiments of the presently described technology are directed to systems and methods for using a common circuit board assembly that works with both a tactile switch and a touch pad capability.

It is understood that the term touch pad, as that term is used throughout this application refers to all forms of touch sensitive control panels that activate a switch when the presence of an object, such as a stylus or a human finger, for example, are detected. Throughout this application, the terms capacitive touch pads, touch sensors, capacitive touch sensors, touch panels, capacitive touch panels, touch keys, capacitive touch keys, touch switches, capacitive touch switches are all considered to be touch pads as defined herein. The term tactile switch, as that term is used throughout this application refers to a switch, key, lever or button that is mechanically activated, such as by the press of a button or lever, such as a rocker switch, for example. Throughout this application, the terms mechanical key, tactile key, mechanical switch, mechanical button, tactile switch, tactile button or tactile panel are considered to be tactile switches as defined herein. Further, the term electrical connection, as that term is used throughout this application means any connection by which an electrical or electronic signal may be transmitted. A system can be in electrical connection or electrical continuity, as that term is used herein, even if they are not in direct or indirect physical contact, if an electric signal can be transmitted. For example, a non-conductive layer can exist between the conductive portions of a system and the system can still be in electrical connection (or in electrical continuity).

FIG. 1 depicts an example of a control panel interface 200 for use on a refrigerator/freezer/ice maker appliance in accordance with the presently described technology; however, the interface of the presently described technology may be used in other appliances such as microwaves, stoves, ovens, dishwashers, washers, dryers, etc. A display area 210 depicts various functions provided by the appliance, such as the refrigerator temperature and the display light, as well as offering various options, such as dispensing water, crushed ice or cubed ice and other various functions. Below the display 210 is an input interface 220, comprising a plurality of keys 222 where a user operates the control panel 100. By activating one or more of the keys 222 on the input interface 220, the user uses the control panel 100 to operate various functionalities of the appliance. Each of the various keys 222 may provide a different control panel function, such as controlling the control panel light, the refrigerator temperature, dispensing water or ice, pulling up a list of options, or adjusting filter settings, for example.

The keys 222 of the input interface 220 may either be touch keys or tactile switches, depending on the embodiment of the control panel. In the embodiment depicted in FIG. 1, the keys 222 are touch keys. The touch keys 222 operate such that when an object, such as the user's finger is detected as touching the key 222, the key 222 is activated, and a signal is sent to the control panel 100. For example, when the control panel 100 detects a user's finger is touching the key 222 identified as "Light," the control panel 100 activates the functionality associated with that key 222, which may be to turn on or off the backlight to the display area 210 of the control panel interface 200, for example.

Figure 2:
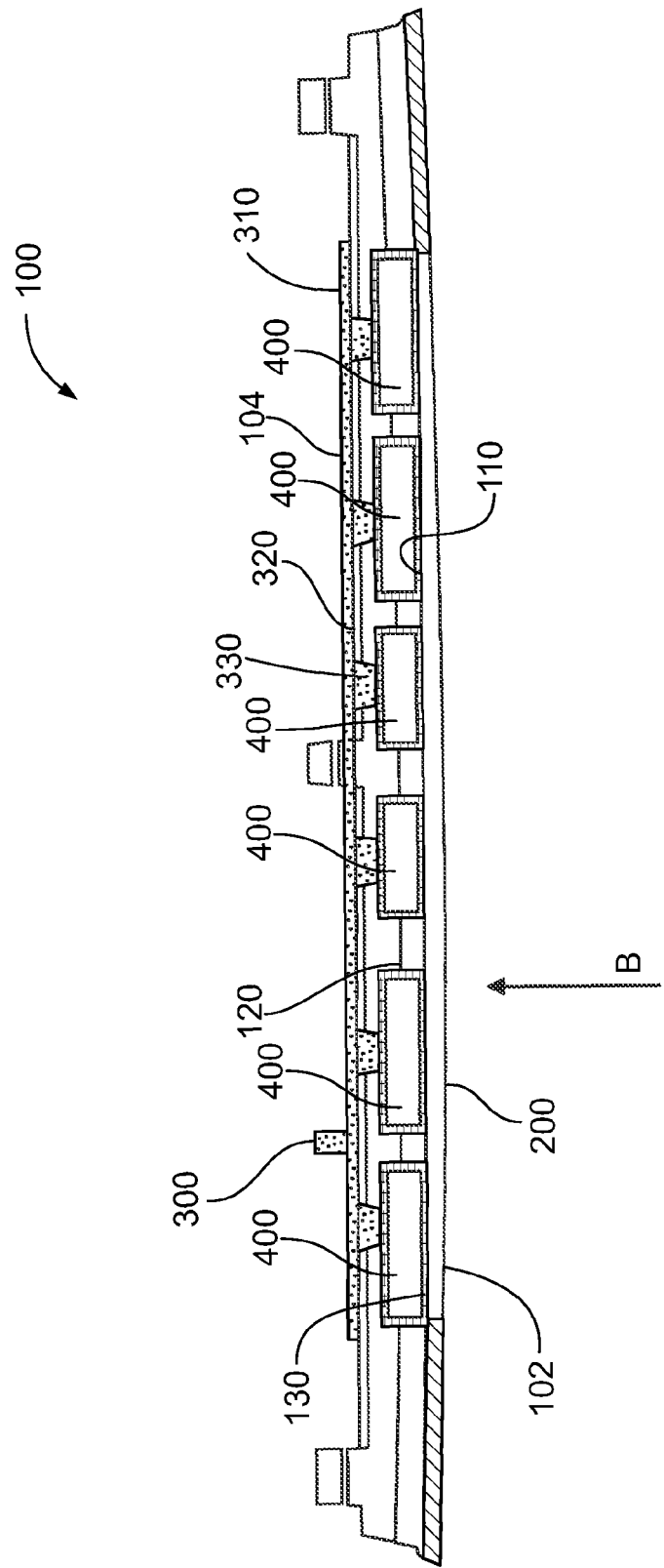
FIG. 2 depicts a cross sectional view of the appliance control panel of FIG. 1.

FIG. 2 depicts a cross sectional view of a control panel 100 viewed in the direction shown by the cross section line A of FIG. 1. A user of the control panel 100 looks in direction B (as shown in FIG. 2), such that exterior surface 102 is on the exterior of the appliance, for example, the outside of a refrigerator. The surface 102 may be comprised of a plastic material. In certain embodiments, the surface 102 may comprise a substrate that is capable of transmitting an electrical signal, for example, when touched by a user. The rear surface 104 of the control panel 100 cannot be seen by a user in a normal operational state. Surface 102 comprises the control panel interface 200 having display 210, input interface 220 and one or more keys 222 or switches for operating the control panel 100. For example, surface 102 may have a digital display 210 that depicts the mode and/or functions controlled by the panel.

A circuit board assembly such as a printed circuit board 310, or "PCB," is shown at the rear surface 104 of the control panel 100. The PCB 310 is used to mechanically support and electrically connect electronic components of the appliance and the control panel using conductive pathways, tracks or traces. A Printed Circuit Board Assembly 300, or "PCBA," comprises the PCB 310 as well as an input receptor panel 320. The input receptor panel 320 comprises one or more input receiver pads 330. The input receiver pads 330 receive signals from the keys of the control panel and transmit those signals to the PCB.

Figure 3:
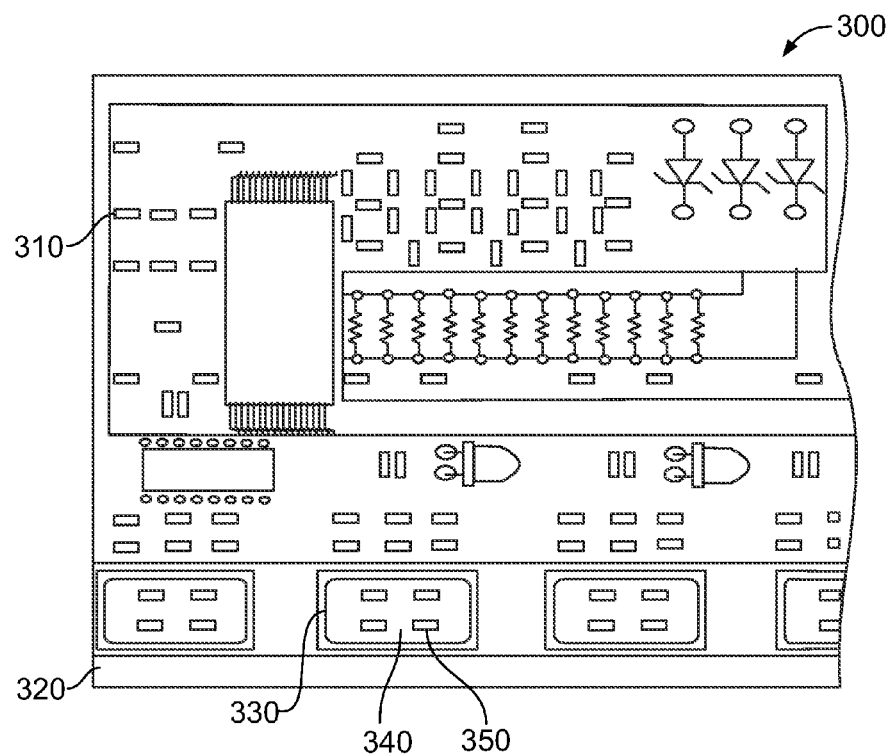
FIG. 3 depicts a portion of a circuit board assembly in accordance with an embodiment of the presently described technology.

FIG. 3 depicts a portion of PCBA 300 in accordance with an embodiment of the presently described technology. The PCBA 300 comprises a PCB 310 having the necessary electronic circuitry and/or pathways to operate the control panel. The PCBA 300 of FIG. 3 is also shown having an input receptor panel 320 comprising multiple input receiver pads 330. The input receiver pads 330 of FIG. 3 comprise a conductive surface 340 and tactile switch soldering pads 350, and can thus be configured for operating with a control panel 100 using either tactile switch keys or touch pads, as discussed below.

As shown in FIG. 2, a gap 120 is shown between the interior surface 130 of the control panel interface 200 and the PCBA 300. A plurality of conductive extenders 400 are disposed between the control panel interface 200 and the PCBA 300 to transmit a signal between the interface 200 and the PCBA 300. For example, when the control panel 100 uses touch keys and a user selects a key 222 from the interface 200, the extenders 400 (which can be a conductive material such as a foam pad surrounded by a conductive fabric band, for example) transmit a capacitive or otherwise electronic signal to the PCBA 300. In certain embodiments, extenders 400 may be used to transmit alternative types of signals such as mechanical, sound, infrared or ultrasonic signals, for example. In certain embodiments, the interior surface 130 of the interface 200 may comprise a metal plating 110 such as a copper plating. The metal plating 110 may be at a point of contact with the extender 400 to provide an improved electrical connection between the interface 200 and the extender 400. In certain embodiments of the presently described technology, the extenders 400 are comprised of a compressible material so that they maintain their position and connectivity in the control panel when the surface 102 of the control panel 100 is compressed from being touched or pressed by a user. Where the control panel 100 comprises tactile switches, the control panel 100 may use a button or a lever in place of the extender 400 to mechanically transmit the signal that a switch has been pressed by a user.

Figure 4:
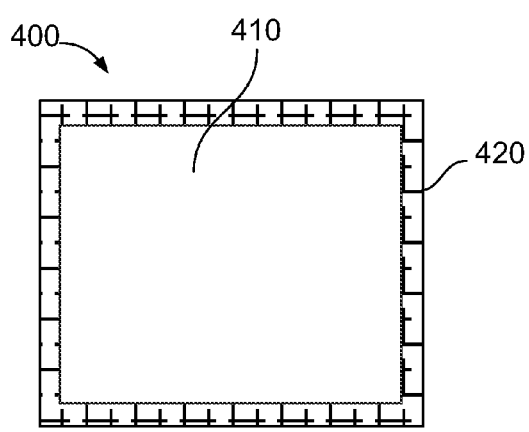
FIG. 4 depicts a top view of an extender as used in accordance with an embodiment of the presently described technology.

FIG. 4 depicts a view of an extender 400 as it would be seen from the top view a control panel of FIG. 2. The extender 400 comprises a foam block 410 or blocks, or a foam layer or layers surrounded by one or more conductive bands 420 (depicted by the hatching pattern of FIGS. 4 and 5). The conductive band 420 (or bands) may be comprised of a metal, a conductive fabric, or other conductive material, for example. The conductive band 420 may surround the entirety of the foam block 410 or just a portion thereof as long as it is sufficient to transmit a signal between the interface 200 of the control panel 100 and the receiver pads 330 of the PCBA 300. Further, the conductive band 420 may extend across the entire surface of the foam block 410, or just a portion thereof. The foam block 410 may comprise an insulating or non-conductive material. In certain embodiments, the extenders 400 may be comprised of other materials, however, it is preferred that the extender 400 is comprised of a compressible material. For example, the extender 400 may be a spring, or may be comprised of a conductive rubber material, for example. The embodiment depicted in FIG. 4 depicts an extender 400 that is square in shape; however, other shapes (e.g., circles, ovals, cylinders, spheres, pyramids or rectangular blocks, etc.) may be used. For example, the extender 400 may be rectangular or another shape configured to fit into a location, or to mate with various surface (e.g., the interior interface surface or the receiver pads of the PCBA) or shapes as needed.

Figure 5:
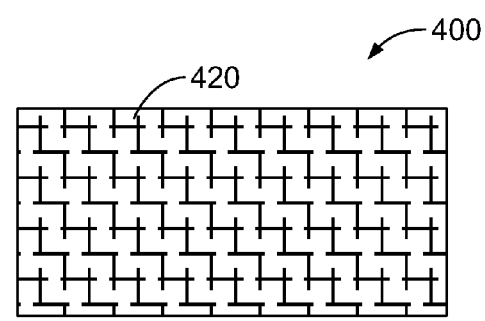
FIG. 5 depicts a front view of the extender of FIG. 4.

FIG. 5 depicts a front view of the extender 400 of FIG. 4 as it would be seen looking in viewing direction B of FIG. 2. As shown in FIG. 5, the conductive band 420 covers the entire surface of the extender 400 so as to provide a greater contact surface area between the extender 400 and the portions of the interior surface 130 of the input interface 200 of the control panel 100 and the input receiver pad 330 of the PCBA 300 that is in contact with the extender 400. The ability of the extender 400 to compress provides adaptability for the control panel. Because the extender 400 is preferably in contact with both the PCBA and the rear surface of the control panel interface 200 to provide an optimal connection, the extender 400 can compress when the surface is touched by a user. For example, in FIG. 2, the extenders 400 are shown in a compressed state. In certain embodiments, an adhesive is applied to either the extender 400 or the surface(s) to which the extender 400 is connected to ensure that the extender 400 maintains its position in the control panel 100.

The extender 400 transmits a signal that is capable of being received by the receiver pads 330 of the PCBA 300 when a user touches the touch pad while minimizing the amount of noise transmitted. A large amount of noise can result in false signals being generated, or can reduce the likelihood that an actual touch generates a proper signal. Certain embodiments of the presently described technology include extenders 400 that provide a minimum signal to noise ratio of 6 to 1 for the control panel system 100. In certain embodiments the minimum signal to noise ratio of the system of 8 to 1.

Figure 6:
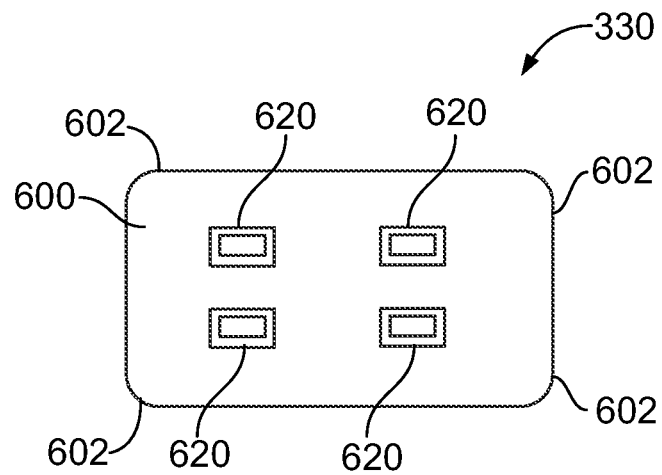
FIG. 6 depicts a view of a receiver pad from a circuit board assembly in accordance with an embodiment of the presently described technology.

FIG. 6 depicts an embodiment of a receiver pad 330. The receiver pad 330 can be a part of the receptor panel 320 of a PCBA as shown in FIG. 3. As shown in FIG. 6, the receiver pad 330 can be essentially rectangular in shape, having a length approximately twice as wide as the width of the pad; however other shapes can also be used. For example, the receiver pad 330 can be round in shape such as a circle or oval, or the receiver pad 330 can be triangular pentagonal or hexagonal in shape. The receiver pad 330 may vary in size. For example, in certain embodiments, the receiver pad 330 can be about 20 mm in length and about 10 mm in width. Other embodiments, for example, can provide a pad that is 10, 20, 30, 40 or 50 mm in length and 10, 20, 30, 40 or 50 mm in width. In other embodiments of the presently described technology, the receiver pad 330 can be configured to adapt to an extender 400 or a tactile switch 700 or other mating device. In certain embodiments, the corners 602 of the receiver pad 330 are rounded, eliminating sharp corners.

The receiver pad 330 comprises a receiver pad surface 600 which can be a plate, for example. The receiver pad surface 600 is comprised of a conductive material, such as a metal material. In certain embodiments, the surface 600 is comprised of a copper material. The receiver pad 330 depicted in FIG. 6 is configured to be operable with both a tactile switch and a touch pad. Disposed on the receiver pad 330 are four tactile switch connectors 620 (such as soldering pads), which allow the receiver pad 330 to be connected to a tactile switch 700. In certain embodiments, alternative numbers of tactile switch connectors 620 can be used. For example, some receiver pads 330 may comprise only two tactile switch connectors for connection to a tactile switch. In other embodiments, a greater or lesser number of tactile switch connectors may be used.

Figure 7:
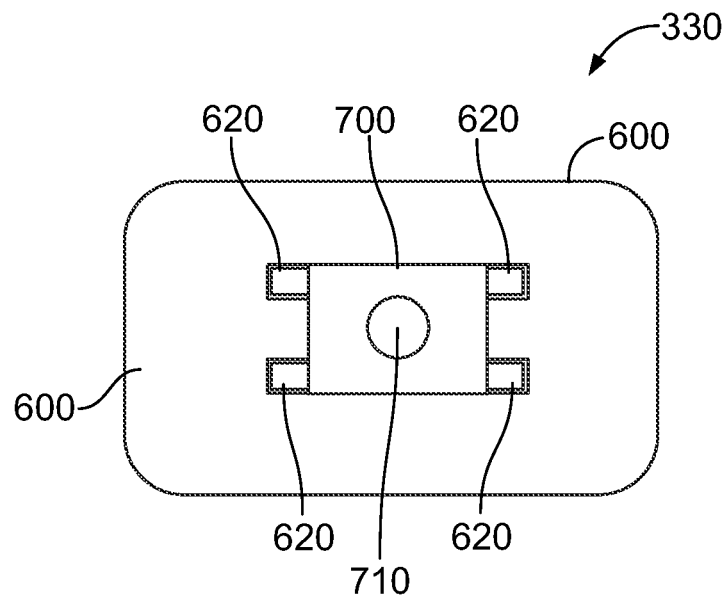
FIG. 7 depicts a view of the receiver pad of FIG. 6 having a tactile switch connected thereto.

As shown in FIG. 7, a tactile switch 700 having a tactile switch button 710 is connected to the receiver pad 330. In certain embodiments, the receiver pad 330 connected to a tactile switch 700 is part of a control panel having an interface with tactile switch keys. In operation, a user may press a button, switch or key on the user interface which causes the tactile switch button 710 to depress, thereby generating a signal to the PCBA. The tactile switch 700 can be connected to the receiver pad 330 by soldering to tactile switch connectors 620 (or soldering pads), for example. An electrical connection can be established between the tactile switch 700 and the receiver pad 330 when the tactile switch is populated.

The same receiver pad 330 can be used to electrically connect to a conductive extender 400, such as the extender 400 depicted in FIGS. 4 and 5. In certain embodiments, there may be a soldermask or other thin non-conductive layer between the conductive portion of the receiver pad 330 and the extender, however, the extender 400 and the receiver pad 330 can still be in electrical connection in this embodiment such that a signal may still be transmitted between an extender 400 and the receiver pad 330. The conductive band 420 of the extender 400 contacts the receiver pad surface 600, which can be, for example, a copper plate. An adhesive may be used to maintain a connection between the extender 400 and the receiver pad 330. On the end of the extender 400 opposite the end in connection with the receiver pad 330, the conductive surface 600 forms an electrical connection with the interior surface of the interface 200, such as surface 130 of FIG. 2, via the extender 400. In certain embodiments, the surface 130 can have a metal plate 110 or plating applied to the area where the surface 130 will contact the extender 400. As with the connection with the receiver pad 330, an adhesive may be used between the extender 400 and the interface surface 130 to maintain connection therebetween. In this embodiment, when a user touches the interface 200 at the location where the interface 200 is in contact with the extender 400, the extender 400 transmits a signal to the PCBA 300 via the receiver pad 330. The location on the interface 200 in connection with the extender 400 can be a touch pad, and may be delineated as such with markings depicting the touch areas as shown by the keys 222 in FIG. 1.

Figure 8:
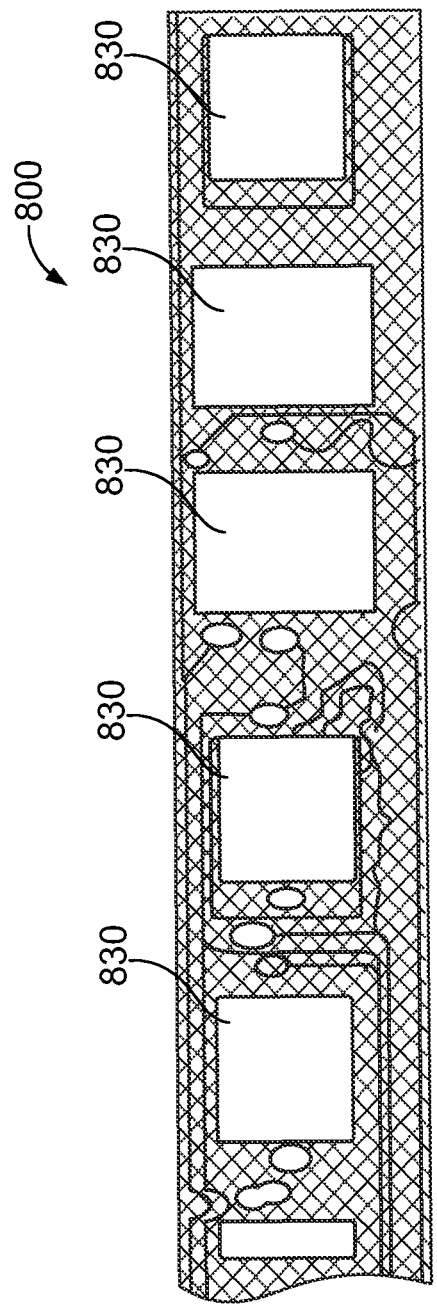
FIG. 8 depicts a portion of a circuit board assembly demonstrating the current state of the art.

The presently described technology provides improvements over the state of the art by providing ways for providing a single PCBA 300 that can be used with both tactile switch and touch pad control panels. Previous capacitive touch devices, such as those depicted by the receptor panel 800 for a circuit board assembly in FIG. 8, provide receiver pads adaptable only for use with capacitive touch pads. For example, the device depicted by FIG. 8 does not have tactile switch connectors on the receiver pads 830, and is thereby not adaptable for connection to a tactile switch. Where the receptor panel 800 is used in a touch control panel, an entirely different receptor panel and PCBA would be required to be used to allow for a control panel utilizing tactile switches. As such, the presently described technology provides improvements and advantages over the state of the art.

The presently described technology provides systems and methods for providing a control panel 100 for an appliance that is adaptable for both capacitive touch functionality and tactile switch functionality. In certain embodiments, a control panel 100 is provided having an interface 200 having at least one capacitive touch key 222. The interface 200 can be comprised of a plastic or another material. A circuit board assembly 300, for example, a PCBA, having at least one input receiver pad 330 is provided. The input receiver pad 330 comprises a conductive material, for example, metal plate 110 or a copper plate. The receiver pad 330 can be rectangular in shape. In certain embodiments, the control panel interface 200 is not in direct contact with the circuit board assembly 300. The control panel 100 further comprises a conductive extender 400 situated between the interface 200 and the PCBA 300. The extender 400 may comprise a foam block 410 and a conductive band 420 on at least a portion of the exterior surface of the extender 400. The extender 400 may correspond in shape with the receiver pad 330 such that the surface of the extender 400 that contacts the receiver pad 330 corresponds to the shape of the receiver pad 330. The extender 400 transmits an electronic signal to the circuit board assembly 300 when a user selects the touch pad key 222 positioned above or in front of the extender 400 on the interface 200, for example, by pressing a touch key 222 with the user's finger or a stylus. Thus, the touch key 222 is in electrical connection with the input receiver pad 330 via the extender 400. In certain embodiments, the receiver pad 330 is adaptable to have a tactile switch 700 pad installed thereon. For example, the receiver pad surface 600 can comprise tactile switch connectors 620 such as soldering pads for connection to a tactile switch 700. In certain embodiments, the signal to noise ratio provided by the system, is at least about 6 to 1, where the signal is measured by the signal generated when a user's finger or other object is present at a touch key 222, and the noise is the signal generated when no finger or other object is present at a touch key 222. In other embodiments, the signal to noise ratio of the system can be at least about 8 to 1. In certain embodiments, other signal to noise ratios may also be sufficient, desirable or optimal for operation, depending on the needs and functions of the system.

Certain embodiments of the presently described technology provide a circuit board assembly 300 that is adaptable for use with each of a capacitive touch control panel and a tactile touch control panel. The circuit board assembly 300 comprises a PCB 310 and a receptor panel 320 electrically connected to the PCB 310. The receptor panel 320 has at least one receiver pad 330 comprising a conductive surface 600 and at least one tactile switch connector 620. The tactile switch connector 620 can comprise, for example, two or four soldering pads. In certain embodiments, a tactile switch 700 can be electrically connected to the receiving pad 330. In certain embodiments, the receiving pad 330 has a surface 600 that is adapted for electrical connection to an extender 400, such as the electrical extenders 400 described herein, for example an extender 400 comprised of a foam block 410 surrounded by a conductive band 420. The receiving pad 330 may be comprised of a metal material, such as a copper plate, for example.

In certain embodiments an appliance control panel system 100, or methods for providing an appliance control panel system, are provided. The method comprises providing a control panel interface 200 having at least one tactile key. The method further comprises providing a circuit board assembly 300, such as a PCBA, having at least one input receiver pad 330 comprising a conductive material. Further, the method comprises providing a tactile extender. The tactile extender may be a lever, a rod, a button, a pad, a cushion or a switch. The tactile extender is positioned between the control panel interface 200 and the circuit board assembly 300. The tactile key is in mechanical connection with the input receiver pad 330 via the extender, such that when the tactile extender is pressed by a user, the extender transmits a signal to the receiver pad. In certain embodiments, the input receiver pad 330 comprises a tactile switch 700, and the tactile extender is configured to activate the tactile switch 700 when a user presses the tactile key.

The presently described technology has now been described in such full, clear, concise and exact terms as to enable any person skilled in the art to which it pertains, to practice the same. It is to be understood that the foregoing describes preferred embodiments and examples of the presently described technology and that modifications may be made therein without departing from the spirit or scope of the invention as set forth in the claims. Moreover, while particular elements, embodiments and applications of the presently described technology have been shown and described, it will be understood, of course, that the presently described technology is not limited thereto since modifications can be made by those skilled in the art without departing from the scope of the present disclosure, particularly in light of the foregoing teachings and appended claims. Moreover, it is also understood that the embodiments shown in the drawings, if any, and as described above are merely for illustrative purposes and not intended to limit the scope of the invention, which is defined by the following claims as interpreted according to the principles of patent law, including the Doctrine of Equivalents. Further, all references cited herein are incorporated in their entirety.

The invention claimed is:

1. An appliance control panel system comprising:
a control panel interface comprising at least one capacitive touch key;
a circuit board assembly comprising at least one input receiver pad, said at least one input receiver pad comprising at least one conductive material; and
at least one conductive extender comprising at least one foam block and at least one conductive band on at least a portion of the exterior surface of said foam block;
wherein said control panel interface is not in direct contact with said circuit board assembly, said conductive extender is situated between said control panel interface and said circuit board assembly, and said at least one capacitive touch key is in electrical connection with said at least one input receiver pad.

2. The appliance control panel system of claim 1, wherein said receiver pad is adaptable for installation of a tactile switch pad.

3. The appliance control panel system of claim 2, wherein said receiver pad comprises at least one tactile switch connector for connection to the tactile switch.

4. The appliance control panel system of claim 1, wherein said conductive band surrounds at least 4 contingent sides of said foam block.

5. The appliance control panel system of claim 4, wherein at least one surface of said conductive extender is in contact with said control panel interface, and at least one surface of said conductive extender is in contact with said receiver pad.

6. The appliance control panel system of claim 1, wherein the receiver pad is comprised of a metal material.

7. The appliance control panel system of claim 6, wherein the receiver pad is comprised of copper.

8. The appliance control panel system of claim 1, wherein the receiver pad is rectangular in shape.

9. The appliance control panel system of claim 8, wherein corners of the receiver pad are rounded.

10. The appliance control panel system of claim 1, wherein the control panel interface is comprised of a plastic material.

11. The appliance control panel system of claim 1, wherein said conductive extender transmits a signal to said at least one receiver pad when a finger touches said capacitive touch key.

12. The appliance control panel system of claim 1, wherein the signal to noise ratio of the system is at least about 6 to 1.

13. The appliance control panel system of claim 12, wherein the signal to noise ratio of the system is at least about 8 to 1.

14. A printed circuit board assembly adaptable for use with each of a capacitive touch control panel and a tactile touch panel comprising:
a printed circuit board;
a receptor panel electrically connected to said printed circuit board, said receptor panel comprising at least one receiver pad, said receiver pad comprising at least one conductive surface and at least one tactile switch connector.

15. The printed circuit board assembly of claim 14, wherein said tactile switch connector comprises at least two soldering pads.

16. The printed circuit board assembly of claim 14, further comprising a tactile switch electrically connected to said receiver pad.

17. The printed circuit board assembly of claim 14, wherein said receiver pad has a surface adapted for electrical connection to a conductive extender, wherein said conductive extender is comprised of at least one foam block surrounded by at least one conductive band.

18. A method for controlling an appliance comprising:
providing a control panel having a control panel interface comprising at least one tactile key;
providing a circuit board assembly comprising at least one input receiver pad, said at least one input receiver pad comprising at least one conductive material; and
providing at least one tactile extender;
wherein said control panel interface is not in direct contact with said circuit board assembly, said tactile extender is positioned between said control panel interface and said circuit board assembly, and said at least one tactile key is in mechanical connection with said at least one input receiver pad via the tactile extender.

19. The method for controlling an appliance of claim 18, wherein said input receiver pad comprises a tactile switch, said tactile extender configured to activate said tactile switch when a user presses said tactile key.

20. The appliance control panel system of claim 1, wherein said foam block comprises a non-conductive foam.

* * * * *